United States Patent
Ye et al.

(10) Patent No.: US 7,427,815 B1
(45) Date of Patent: Sep. 23, 2008

(54) METHOD, MEMORY MEDIA AND APPARATUS FOR DETECTION OF GRID DISCONNECT

(75) Inventors: Zhihong Ye, Clifton Park, NY (US); Pengwei Du, Troy, NY (US)

(73) Assignee: General Electric Company, Niskayuna, NY (US)

( * ) Notice: Subject to any disclaimer, the term of this patent is extended or adjusted under 35 U.S.C. 154(b) by 425 days.

(21) Appl. No.: 10/713,310

(22) Filed: Nov. 14, 2003

(51) Int. Cl.
*H02B 1/24* (2006.01)

(52) U.S. Cl. ..................................................... 307/127
(58) Field of Classification Search .................. 307/127
See application file for complete search history.

(56) References Cited

U.S. PATENT DOCUMENTS

| | | | | |
|---|---|---|---|---|
| 5,749,064 | A * | 5/1998 | Pawate et al. | 704/213 |
| 6,219,623 | B1 | 4/2001 | Wills | |
| 6,304,113 | B1 * | 10/2001 | Dautriche | 327/141 |
| 6,429,546 | B1 | 8/2002 | Ropp et al. | |
| 6,917,124 | B2 * | 7/2005 | Shetler et al. | 307/66 |
| 2004/0178641 | A1 * | 9/2004 | Wall | 290/52 |

FOREIGN PATENT DOCUMENTS

DE 10211206 A1 9/2003

OTHER PUBLICATIONS

Pai, et al. "A Detection Algorithm for Islanding-Prevention of Dispersed Consumer-Owned Storage and Generating Units" IEEE Transactions on Energy Conversion, V. 16; N4; Dec. 2001; p. 346-351.

Jang, et al. "Development of a Logical Rule-based Islanding Detection Method for Distributed Resources". Dept. of Electrical and Computer Engineering; Kangwon National University; IEEE 2002 pp. 800-806.

Zhihong Ye, et al.: "Evaluation of Anti-Islanding Schemes Based on Non Detection Zone Concept", PESC' 03. 2003 IEEE 34th. Annual Power Electronics Specialists Conference. Conference Proceedings. Acapulco, Mexico, Jun. 15-19, 2003, Annual Power Electronics Specialists Conference, New York, NY: IEEE, US, vol. 4 of 4 conf. 34, Jun. 15, 2003, pp. 1735-1741.

Michael E. Ropp, et al., Determining The Relative Effectiveness of Islanding Detection Methods Using Phase Criteria and Nondetection Zones, IEEE Transactions on Energy Conversion, IEEE Service Center, Piscataway, NY US vol. 15, No. 3, Sep. 2000, XP011015575, pp. 290-296.

International Searching Authority Search Report and Written Opinion dated Sep. 29, 2006.

* cited by examiner

*Primary Examiner*—Michael J Sherry
*Assistant Examiner*—Dru M Parries
(74) *Attorney, Agent, or Firm*—Ann M. Agosti

(57) ABSTRACT

A phase shift procedure for detecting a disconnect of a power grid from a feeder that is connected to a load and a distributed generator. The phase shift procedure compares a current phase shift of the output voltage of the distributed generator with a predetermined threshold and if greater, a command is issued for a disconnect of the distributed generator from the feeder. To extend the range of detection, the phase shift procedure is used when a power mismatch between the distributed generator and the load exceeds a threshold and either or both of an under/over frequency procedure and an under/over voltage procedure is used when any power mismatch does not exceed the threshold.

6 Claims, 4 Drawing Sheets

METHOD, MEMORY MEDIA AND APPARATUS FOR DETECTION OF GRID DISCONNECT

CROSS-REFERENCE TO RELATED APPLICATIONS

The U.S. Government may have certain rights in this invention pursuant to contract number AND-1-30605-01 awarded by the U.S. Department of Energy.

BACKGROUND OF INVENTION

The present disclosure relates to a method and apparatus for detection of a disconnection of the power grid. More particularly, the present disclosure relates to islanding and the prevention thereof.

Islanding of a grid-connected distributed generator (DG) occurs when a section of the grid containing the DG is disconnected from the main utility, but the DG continues to energize the grid lines in the isolated section (termed as an island). For example, consider a DG system connected to a feeder through a transformer. A load (not owned by the DG owner) is also connected to the same feeder through another transformer. If a grid disconnect device (circuit breaker, recloser, fuse, or sectionalizer) opens, it is possible for the DG to continue to supply current to the isolated section of the grid. This is islanding, and the isolated section of the grid being powered by the DG system is referred to as an island.

Accordingly, there is a continuing desire for a method and controller that prevent islanding.

BRIEF DESCRIPTION OF THE INVENTION

In a method embodiment of the invention islanding is prevented in a power system that includes a power grid having a feeder connected in circuit with a distributed generator and at least one load. The method determines a phase shift of a voltage at an output of the distributed generator. The phase shift is compared to a threshold phase shift that signifies a phase shift due to a disconnect of the grid from the feeder. If the phase shift is greater than the threshold phase shift, a command is issued for a disconnect of the distributed generator from the feeder.

In another method embodiment of the invention islanding is prevented in a power system that includes a power grid having a feeder connected in circuit with a distributed generator and at least one load. The method determines a disconnect of the grid from the feeder by a phase shift procedure when a power mismatch between the distributed generator and the load exceeds a threshold. The method further determines the disconnect by either or both of an under/over frequency procedure and an under/over voltage procedure when any power mismatch does not exceed the threshold.

In a controller embodiment of the invention islanding is prevented in a power system that includes a power grid having a feeder connected in circuit with a distributed generator and at least one load. The controller comprises a processor, a memory and an input/output unit. The memory includes a grid disconnect program that causes the processor to determine a phase shift of a voltage at an output of the distributed generator. The program also causes the processor to compare the phase shift to a threshold phase shift that signifies a phase shift due to a disconnect of the grid from the feeder. If the phase shift is greater than the threshold phase shift, the processor issues a command for a disconnect of the distributed generator from the feeder.

DETAILED DESCRIPTION OF THE INVENTION

Figure 1:
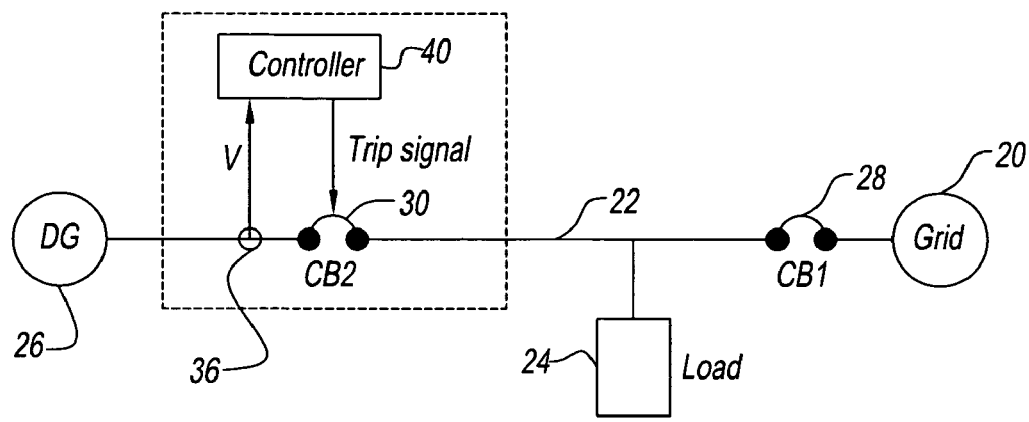
FIG. 1 is block diagram of an embodiment of a power grid disconnect detection apparatus.

Referring to FIG. 1, an electrical power grid 20 is connected to a feeder 22 that is connected in a circuit with a load 24 and a DG 26. GRID 20 is connected with a public utility (not shown). A disconnect device 28 is disposed in feeder 22 for the purpose of disconnecting grid 20 from feeder 22 should abnormal disturbances occur in grid 20. Another disconnect device 30 is disposed in feeder 22 for the purpose of disconnecting DG 26 from feeder 26. It will be apparent to those skilled in the art that more than one load can be connected to feeder 22 and that DG 26 and load 24 may be connected to feeder 22 via transformers (not shown).

Disconnect devices 28 and 30 may be any suitable disconnect devices, such as circuit breakers, reclosers, fuses, sectionalizers and the like. DG 28 may be any distributed generator or a group of distributed generators, such as a photovoltaic system, a fuel cell, a microturbine, a small engine and the like.

If disconnect device 28 opens, it is possible for DG 26 to continue to supply current to feeder 22, which would be isolated from grid 20 due to the open disconnect device 28. This is islanding and the isolated section of the grid (feeder 22 and circuits connected thereto) is referred to as an island.

A voltage measuring device 36 monitors the voltage at the output of DG 26. Voltage measuring device 36 provides samples of the monitored voltage to a controller 40. Controller 40 processes the voltage samples to detect a phase jump that occurs when grid 20 is disconnected by action of disconnect device 28.

Under normal conditions, the output voltage of DG 26 is regulated by grid 20. When grid 20 is disconnected by the opening of disconnect device 28, DG 26 becomes islanded. If there is a power mismatch between DG 26 and load 24, the voltage vector will shift its phase in order to balance the reactive power due to Ohm's law. This phase shift normally occurs right after grid 20 is disconnected.

In a first embodiment of the invention, detection of the phase jump tries to capture the phase change of the voltage vector in the first one or few cycles based on the voltage measurement and then sends a trip signal to disconnect device 30, which opens. This action disconnects DG 26 from feeder 22, thereby preventing islanding.

The relationship between the power mismatch an the phase jump θ can be derived as follows:

$$\left|\arctan\left(\frac{\Delta Q/P}{1+\Delta P/P}\right)\right| \leq \theta_{threshold} \tag{1}$$

where $\Delta P$ and $\Delta Q$ are power mismatch and $\theta_{threshold}$ is the phase jump setting threshold.

If the phase shift θ is greater than the threshold phase shift $\theta_{threshold}$, the phase jump (i.e., grid 20 disconnect) is detected.

If the phase shift θ is equal to or less than the threshold phase shift $\theta_{threshold}$, any phase shift is assumed to be due to normal disturbances.

The phase shift $\theta_{threshold}$ is selected based on the maximum possible disturbances of the system in which the device is used. The threshold should be larger (with certain margin) than the phase shift caused by the disturbances so as to avoid a falxe trip during normal grid connected operation.

Equation (1) reveals that if the power mismatch ΔP and ΔQ at the time of grid disconnect satisfy the condition ($\theta \leq_{threshold}$), then the islanding cannot be detected because the actual phase jump is smaller the threshold.

It can also be seen from Equation (1) that the effectiveness of the phase jump method is not influenced by the quality factor Qf of load 24. Under/over frequency protection becomes less effective with higher quality factor load.

In a second embodiment of the invention, the phase shift detection method is combined with under/over frequency and under/over voltage protection. This combination reduces the non-detection zone (defined in ΔP and ΔQ space, ΔP and ΔQ being small enough within the zone for the detection processes to respond) of under/over frequency protection. Also, it can be seen that the phase jump method is not very effective with high active power mismatch, but under/over voltage protection is sensitive to high active power mismatch. Therefore, combining the phase jump, under/over frequency, and under/over voltage will result in a reduced anti-islanding non-detection zone. In this embodiment, the phase shift procedure is used to determine the grid disconnect if a power mismatch between DG 26 and load 24 exceeds a threshold and either or both of the under/over frequency procedure and the under/over voltage procedure is used if any power mismatch does not exceed the threshold. This embodiment may employ any conventional under/over procedure for frequency and under/over voltage procedure.

Voltage measuring device 36 continuously monitors the voltage at the output of DG 26 and sends samples thereof to controller 40. Based on the measured voltage, frequency can be computed, either based on zero-crossing, phase lock loop, DQ (direct quadric) phase lock loop, or other frequency tracking procedures.

Figure 2:
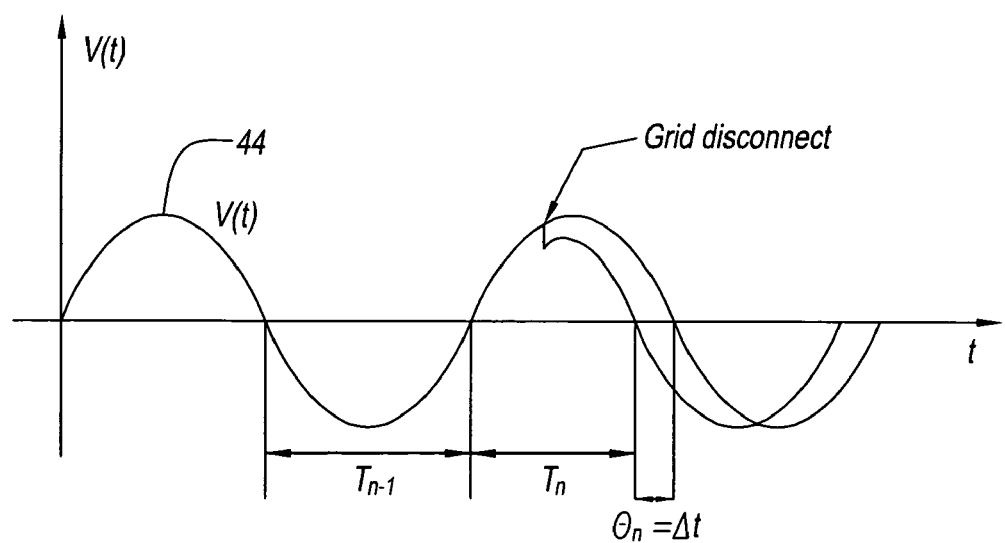
FIG. 2 is a waveform diagram of the output voltage of the data generator of the FIG. 1 apparatus.

Referring to FIG. 2, an example of the zero-crossing technique is depicted by a voltage characteristic waveform 44 after grid 20 is disconnected. Before grid 20 is disconnected, the frequency can be measured based on the time period, defined as $T_{n-1}$, of the two consecutive waveform zero crossings. After grid 20 is disconnected, there will be a phase shift due to DG 26 and load power mismatch. Then the next time period, defined as $T_n$, of the two consecutive zero-crossings will be different from $T_{n-1}$. Here $T_n$ and $T_{n-1}$ are the inverse of the two consecutive frequency measurement: $f_n=(1/T_n)$ and $f_{n-1}=(1/T_{n-1})$. Based on the previously measured frequency $f_{n-1}$, the next zero crossing time can be calculated as if there were no grid disconnection. The angle between the calculated zero-crossing and the actually measured zero crossing is the phase shift, $\theta_n$, due to the grid disconnection and is given by:

$$\theta_n = 2\pi \cdot \left(1 - \frac{f_{n-1}}{f_n}\right) \quad (2)$$

To improve the performance, an alternative embodiment of the invention, instead of using the phase change of one period with two consecutive measurements, uses three periods. In this case, although more storage is needed, the security and reliability are significantly improved. The reason is, due to grid transients, some phase change may occur momentarily even without grid disconnection. Controller 40 may pick up those transients as an islanding event and cause a false trip. Those transients are normally causing the frequency up and down momentarily, rather than drifting away in one direction. Therefore, by doing three periods, the short-term frequency oscillation will not cause too much phase change. The implementation of the three-period measurements can be expressed below:

$$\theta_{total} = \theta_{n-2} + \theta_{n-1} + \theta_n = 2\pi \cdot \left(3 - \frac{f_{n-3}}{f_{n-2}} - \frac{f_{n-2}}{f_{n-1}} - \frac{f_{n-1}}{f_n}\right) \quad (3)$$

Figure 3:
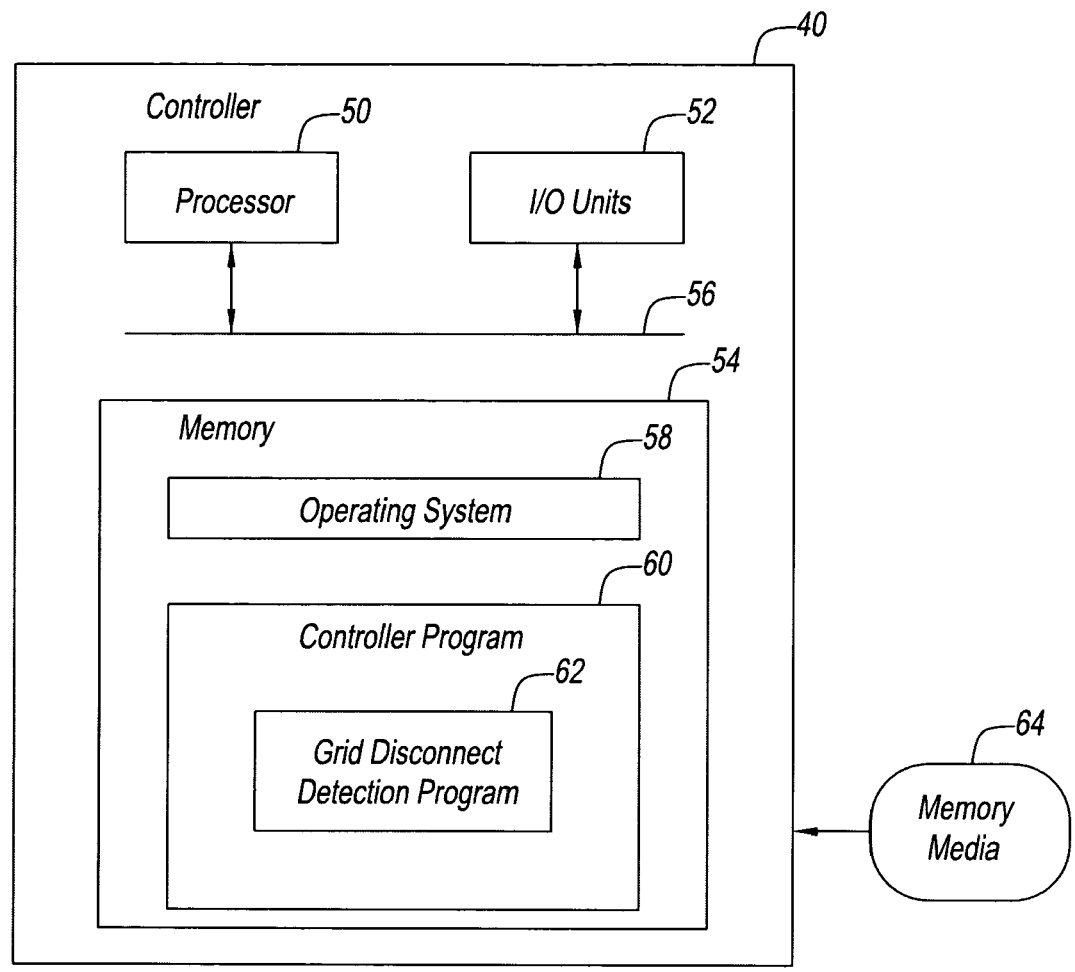
FIG. 3 is a block diagram of the controller of the FIG. 1 apparatus.

Referring to FIG. 3, controller 40 includes a processor 50, an input/output (I/O) unit 52, a memory 54 and a bus 56. Bus 56 interconnects processor 50, I/O unit 52 and memory 54. I/O unit 52 includes any desired I/O device, such as a keyboard, display, printer, communications device for communicating over a network, ports for receiving signals (e.g., the voltage samples from voltage measuring device 36) or for sending signals (e.g., a trip signal to disconnect device 30) and the like. Memory 52 includes an operating system 58 and a controller program 60. Controller program 60 includes a grid disconnect detection program 62. A memory media 64 (e.g., a disk) contains a copy of grid disconnect program 62 and may also include a copy of operating system 58, controller program 60, or other software, which can be loaded into memory 54.

Operating system 58 controls processor 50 to execute controller program 60 and grid disconnect detection program 62 for detecting a disconnect of grid 20 from feeder 22. Grid disconnect program 62 processes the voltage samples to determine a phase shift $\theta_n$ between a current zero crossing and one or more previous zero crossings. The phase shift $\theta_n$ is compared to the phase shift threshold $\theta_{threshold}$ and if greater, the phase shift $\theta_n$ indicates a grid disconnect. A command is then issued that causes a trip signal to be sent to disconnect device 30 to disconnect DG 26 from feeder 22.

Figure 4:
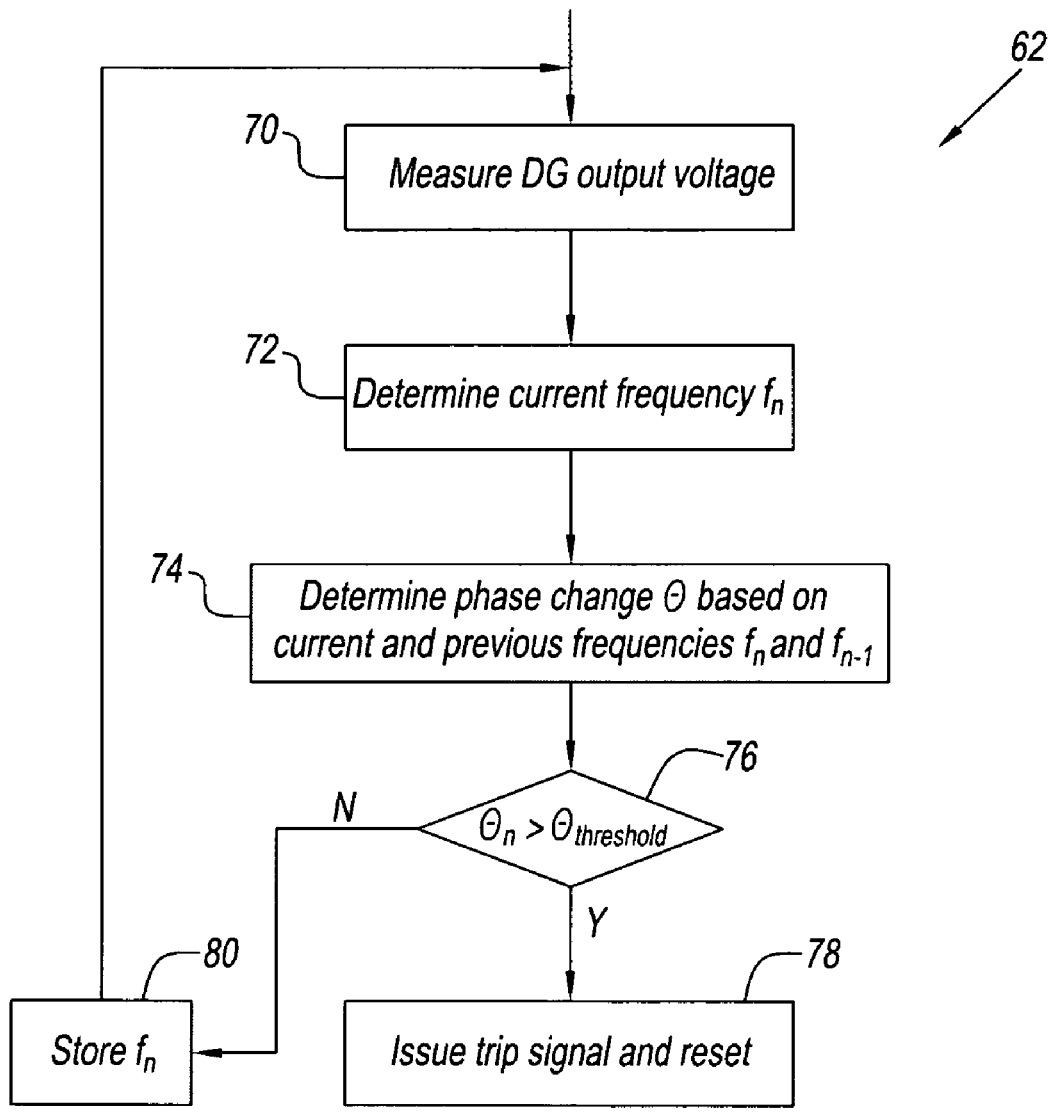
FIGS. 4 and 5 are flow diagrams of the grid disconnect detection program of the controller of FIG. 3.

Referring to FIG. 4, a first embodiment of grid disconnect detection program 62 measures the output voltage of DG 26 at step 70. Step 70 receives the voltage samples and determines the zero-crossing times. Step 72 determines the current frequency $f_n$ based on the current zero-crossing. Step 74 determines the phase change $\theta_n$ based on the current frequency $f_n$ and the previous frequency $f_{n-1}$. For example, step 74 uses Equation 2. Step 76 compares the current phase shift $\theta_n$ to the threshold phase shift $\theta_{threshold}$. If the current phase shift $\theta_n$ is greater, step 78 issues a command to generate a trip signal that trips disconnect device 30, thereby disconnecting DG 26 from feeder 22. If the current phase shift $\theta_n$ is equal to or less than the threshold phase shift $\theta_{threshold}$, step 80 stores the current frequency $f_n$ for use during the next iteration. Steps 70 through 76 and 80 are repeated continuously until step 76 determines that the current phase shift $\theta_n$ is greater than the threshold phase shift $\theta_{threshold}$. Step 78 then issues the command for the trip signal and resets program 52.

Figure 5:
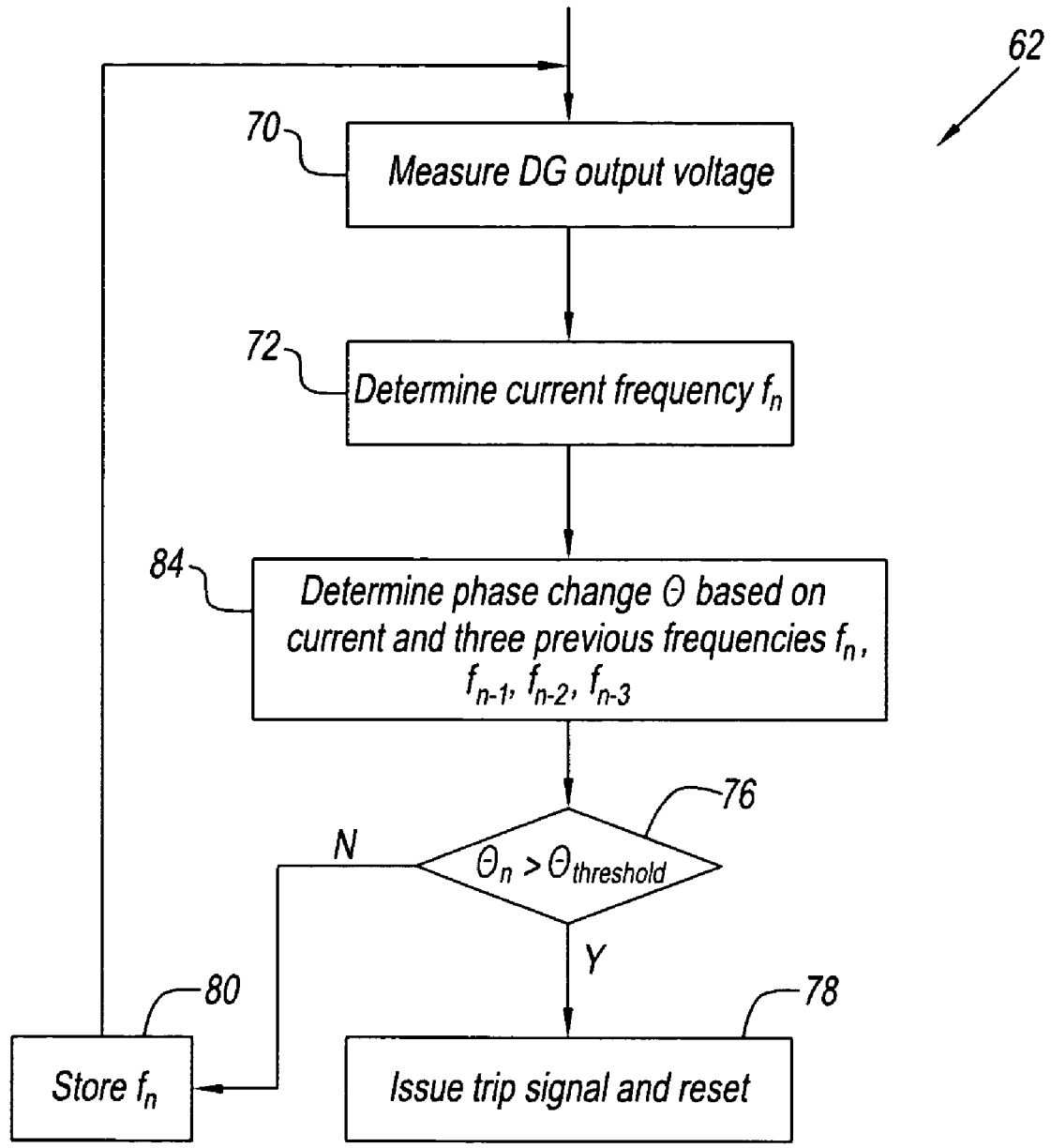

Referring to FIG. 5, another embodiment of grid disconnect program 62 is the same as the embodiment shown in FIG. 4 except that the current phase change $\theta_n$ is determined based on the current frequency $f_n$ and the three previous frequencies $f_{n-1}$, $f_{n-2}$, and $f_{n-3}$. Steps in FIG. 5 that are identical to those shown in FIG. 4 bear the same reference numerals. Step 74 of FIG. 4 is replaced in FIG. 5 by step 84 which makes the phase shift determination based on current frequency $f_n$ and the three previous frequencies $f_{n-1}$, $f_{n-2}$, and $f_{n-3}$. For example, step 84 may use Equation (3).

Regardless of where the instructions for the program steps are stored, when they are executed by the processor, they provide a technical effect of facilitating the detection of grid disconnect from circuits that include a DG.

It should also be noted that the terms "first", "second", "third", "upper", "lower", and the like may be used herein to modify various elements. These modifiers do not imply a spatial, sequential, or hierarchical order to the modified elements unless specifically stated.

While the present invention has been described with reference to one or more exemplary embodiments, it will be understood by those skilled in the art that various changes may be made and equivalents may be substituted for elements thereof without departing from the scope of the present invention. In addition, many modifications may be made to adapt a particular situation or material to the teachings of the disclosure without departing from the scope thereof. Therefore, it is intended that the present invention not be limited to the particular embodiment(s) disclosed as the best mode contemplated for carrying out this invention, but that the invention will include all embodiments falling within the scope of the appended claims.

What is claimed is:

1. A method for preventing islanding in a power system that includes a power grid having a feeder connected in circuit with a distributed generator and at least one load, said method comprising:

determining a phase shift of a voltage based solely on sequential frequency measurements at an output of said distributed generator;

comparing said phase shift to a threshold phase shift that signifies a phase shift due to a disconnect of said grid from said feeder; and is said phase shift is greater than said threshold phase shift, issuing a command for a disconnect of said distributed generator from said feeder, wherein said phase shift is determined by:

$$\theta_n = 2\pi \cdot \left(1 - \frac{f_{n-1}}{f_n}\right),$$

where $\theta_n$ is said phase shift and $f_n$ and $f_{n-1}$ are the frequencies at a current zero-crossing and a previous zero-crossing of said voltage, respectively.

2. A method for preventing islanding in a power system that includes a power grid having a feeder connected in circuit with a distributed generator and at least one load, said method comprising:

determining a phase shift of a voltage based solely on sequential frequency measurements at an output of said distributed generator;

comparing said phase shift to a threshold phase shift that signifies a phase shift due to a disconnect of said grid from said feeder; and if said phase shift is greater than said threshold phase shift, issuing a command for a disconnect of said distributed generator from said feeder, wherein said phase shift is determined by:

$$\theta_{total} = \theta_{n-2} + \theta_{n-1} + \theta_n = 2\pi \cdot \left(3 - \frac{f_{n-3}}{f_{n-2}} - \frac{f_{n-2}}{f_{n-1}} - \frac{f_{n-1}}{f_n}\right),$$

where $\theta_{total}$ is said phase shift, $\theta_n$, $\theta_{n-1}$, and $\theta_{n-2}$, are the current, the first previous and the second previous phase shifts, respectively, and $f_n$, $f_{n-1}$, $f_{n-2}$, $f_{n-3}$, are the frequencies at a current, a first previous, a second previous and a third previous zero-crossing of said voltage, respectively.

3. A controller for preventing islanding in a power system that includes a power grid having a feeder connected in circuit with a distributed generator and at least one load, said controller comprising:

a processor, a memory and an input/output unit, wherein said memory includes a grid disconnect program that causes said processor to perform the operations of:

determining a phase shift of a voltage based solely on sequential frequency measurements at an output of said distributed generator;

comparing said phase shift to a threshold phase shift that signifies a phase shift due to a disconnect of said grid from said feeder; and is said phase shift is greater than said threshold phase shift, issuing a command for a disconnect of said distributed generator from said feeder, wherein said phase shift is determined by:

$$\theta_n = 2\pi \cdot \left(1 - \frac{f_{n-1}}{f_n}\right),$$

where $\theta_n$ is said phase shift and $f_n$ and $f_{n-1}$ are the frequencies at a current zero-crossing and a previous zero-crossing of said voltage, respectively.

4. A controller for preventing islanding in a power system that includes a power grid having a feeder connected in circuit with a distributed generator and at least one load, said controller comprising:

a processor, a memory and an input/output unit, wherein said memory includes a grid disconnect program that causes said processor to perform the operations of:

determining a phase shift of a voltage based solely on sequential frequency measurements at an output of said distributed generator;

comparing said phase shift to a threshold phase shift that signifies a phase shift due to a disconnect of said grid from said feeder; and if said phase shift is greater than said threshold phase shift, issuing a command for a disconnect of said distributed generator from said feeder, wherein said phase shift is determined by:

$$\theta_{total} = \theta_{n-2} + \theta_{n-1} + \theta_n = 2\pi \cdot \left(3 - \frac{f_{n-3}}{f_{n-2}} - \frac{f_{n-2}}{f_{n-1}} - \frac{f_{n-1}}{f_n}\right),$$

where $\theta_{total}$ is said phase shift, $\theta_n$, $\theta_{n-1}$, and $\theta_{n-2}$, are the current, the first previous and the second previous phase shifts, respectively, and $f_n$, $f_{n-1}$, $f_{n-2}$, $f_{n-3}$, are the frequencies at a current, a first previous, a second previous and a third previous zero-crossing of said voltage, respectively.

5. A memory media for a controller for preventing islanding in a power system that includes a power grid having a feeder connected in circuit with a distributed generator and at least one load, said controller comprising a processor, a memory and an input/output unit, said memory media comprising a grid disconnect detection program that causes said processor to perform the operations of:

determining a phase shift of a voltage based solely on sequential frequency measurements at an output of said distributed generator;

comparing said phase shift to a threshold phase shift that signifies a phase shift due to a disconnect of said grid from said feeder; and if said phase shift is greater than said threshold phase shift, issuing a command for a disconnect of said distributed generator from said feeder, wherein said phase shift is determined by:

$$\theta_n = 2\pi \cdot \left(1 - \frac{f_{n-1}}{f_n}\right),$$

where $\theta_n$ is said phase shift and $f_n$ and $f_{n-1}$ are the frequencies at a current zero-crossing and a previous zero-crossing of said voltage, respectively.

6. A memory media for a controller for preventing islanding in a power system that includes a power grid having a feeder connected in circuit with a distributed generator and at least one load, said controller comprising a processor, a memory and an input/output unit, said memory media comprising a grid disconnect detection program that causes said processor to perform the operations of:

determining a phase shift of a voltage based solely on sequential frequency measurements at an output of said distributed generator;

comparing said phase shift to a threshold phase shift that signifies a phase shift due to a disconnect of said grid from said feeder; and if said phase shift is greater than said threshold phase shift, issuing a command for a disconnect of said distributed generator from said feeder, wherein said phase shift is determined by:

$$\theta_{total} = \theta_{n-2} + \theta_{n-1} + \theta_n = 2\pi \cdot \left(3 - \frac{f_{n-3}}{f_{n-2}} - \frac{f_{n-2}}{f_{n-1}} - \frac{f_{n-1}}{f_n}\right),$$

where $\theta_{total}$ is said phase shift, $\theta_n$, $\theta_{n-1}$, and $\theta_{n-2}$, are the current, the first previous and the second previous phase shifts, respectively, and $f_n$, $f_{n-1}$, $f_{n-2}$, $f_{n-3}$, are the frequencies at a current, a first previous, a second previous and a third previous zero-crossing of said voltage, respectively.

* * * * *

UNITED STATES PATENT AND TRADEMARK OFFICE
CERTIFICATE OF CORRECTION

PATENT NO. : 7,427,815 B1 Page 1 of 1
APPLICATION NO. : 10/713310
DATED : September 23, 2008
INVENTOR(S) : Ye et al.

It is certified that error appears in the above-identified patent and that said Letters Patent is hereby corrected as shown below:

On the Title Page, item (75), under "Inventors", in Column 1, Line 1, delete "Clifton Park," and insert -- Schenectady, --, therefor.

In Column 1, Line 9, delete "AND" and insert -- NAD --, therefor.

In Column 2, Line 56, delete "an" and insert -- and --, therefor.

In Column 5, Line 40, in Claim 1, delete "is said" and insert -- if said --, therefor.

In Column 6, Line 25, in Claim 3, delete "is said" and insert -- if said --, therefor.

Signed and Sealed this

Twelfth Day of May, 2009

JOHN DOLL
*Acting Director of the United States Patent and Trademark Office*